United States Patent
Tan

(10) Patent No.: US 8,000,919 B2
(45) Date of Patent: Aug. 16, 2011

(54) CALIBRATION OF A PARTIALLY SYMMETRIC FIXTURE

(75) Inventor: Kan Tan, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 171 days.

(21) Appl. No.: 12/117,491

(22) Filed: May 8, 2008

(65) Prior Publication Data

US 2008/0281542 A1      Nov. 13, 2008

Related U.S. Application Data

(60) Provisional application No. 60/916,872, filed on May 9, 2007.

(51) Int. Cl.
*G01D 3/00* (2006.01)
*G01R 35/00* (2006.01)

(52) U.S. Cl. .................. 702/108; 324/601

(58) Field of Classification Search .............. 702/108, 702/57, 65–67, 69–70, 79, 81, 84–85, 89, 702/106–107, 117–118, 120, 125, 127, 176–177, 702/179, 182–183, 186, 189–191, 193–194, 702/196; 324/600–602, 605, 612–613, 616–617, 324/620, 622, 624–625, 650
See application file for complete search history.

(56) References Cited

U.S. PATENT DOCUMENTS

| 7,545,151 B2 * | 6/2009 | Martens et al. ............ 324/601 |
| 2008/0258738 A1 * | 10/2008 | Martens et al. ............ 324/601 |
| 2008/0278176 A1 * | 11/2008 | Hagerup et al. ............ 324/601 |

FOREIGN PATENT DOCUMENTS

WO   WO/2008/021885 A2   2/2008

* cited by examiner

*Primary Examiner* — Mohamed Charioui
*Assistant Examiner* — Toan M Le
(74) *Attorney, Agent, or Firm* — Thomas F. Lenihan

(57) ABSTRACT

A method useful for the characterization of a fixture splits a partially symmetric THRU structure into portions which may then be mathematically removed from both ports of a 2-port measured structure, leaving only the desired device under test (DUT).

4 Claims, 1 Drawing Sheet

CALIBRATION OF A PARTIALLY SYMMETRIC FIXTURE

CROSS REFERENCE TO RELATED APPLICATIONS

The subject application claims priority from U.S. Provisional Patent Application Ser. No. 60/916,872, entitled, CALIBRATION OF A PARTIALLY SYMMETRIC FIXTURE (Kan Tan.), filed 9 May 2007, the entire contents of which are herein incorporated by reference.

FIELD OF THE INVENTION

The subject application concerns, in general, the field of test and measurement instruments, and in particular, concerns characterizing partially symmetric test fixtures.

BACKGROUND OF THE INVENTION

PCT patent application serial number PCT/US07/75485, CALIBRATION OF A MIRROR-SYMMETRIC FIXTURE (Doubrava, et al.) (hereinafter Doubrava '485), herein incorporated by reference, introduces a method for the characterization of a symmetric fixture, hereinafter called SymmetriCal. The SymmetriCal method (Doubrava '485) splits a symmetric THRU structure into mirrored Half-fixtures which may then be mathematically removed from both ports of a 2-port measured structure, leaving only the probe (i.e., the desired device under test (DUT)). What is needed is a method that can handle partially-symmetric fixtures.

SUMMARY OF THE INVENTION

A partial symmetric fixture is characterized with a single 2-port S-parameter measurement. The mathematical process splits the fixture into two partially symmetric half-fixtures, completely describing each half in terms of 2-port S-parameters.

DETAILED DESCRIPTION OF THE EMBODIMENTS

Figure 1:
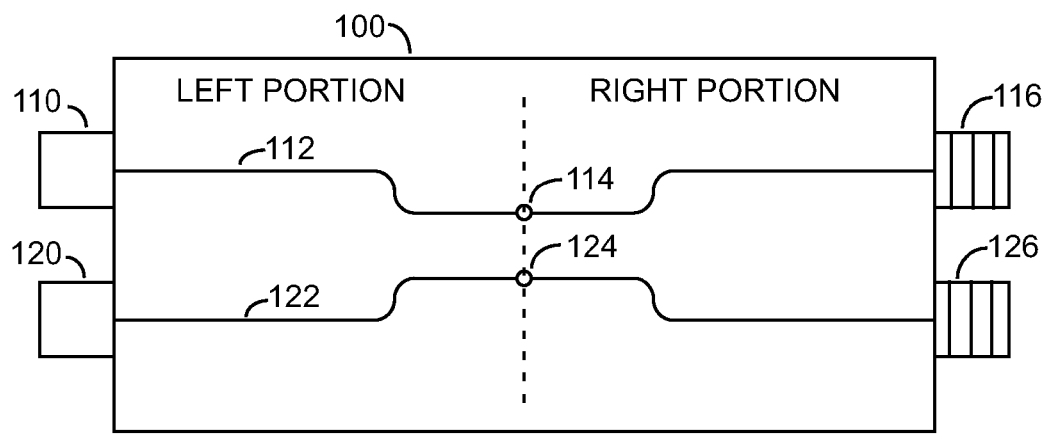
FIG. 1 shows an example of a partially symmetric fixture.

The subject invention is an enhanced method which can handle partially symmetric fixtures. One example of partially symmetric fixture 100 is shown in FIG. 1, where the fixture is mostly symmetric, except for the inter-connectors 110, 120 and 116, 126 which are of two different types. The different connectors at the two sides may facilitate the through (THROU) calibration. Test fixture 100 includes a first trace 112 extending from a first connector 110 through a connection pad 114 to a second connector 116, and a second trace 122 extending from a third connector 120 through a second connection pad 124 to a fourth connector 126.

Figure 2:
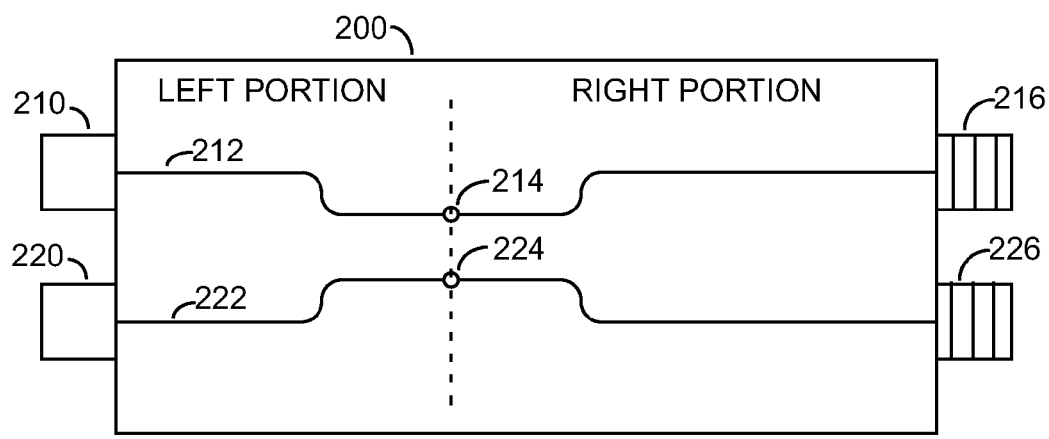
FIG. 2 shows another example of a partially symmetric fixture.

The second example of partially symmetric fixture 200 is shown in FIG. 2, where the fixture is less symmetric than the one in FIG. 1. Elements in FIG. 2 bearing similar reference numerals to those of FIG. 1 serve the same purpose, and need not be described again. In FIG. 2, only the connection pads 214, 224 and their neighboring area are symmetric.

The extended method of the subject invention, called Partial SymmetriCal, can handle fixtures satisfying the partial symmetry requirement. The term "partial symmetry", as used herein means that the junction section between two half sides (LEFT and RIGHT Portions) is symmetric.

The pad areas shown in FIG. 1 and FIG. 2 are symmetric, so the test fixtures in FIG. 1 and FIG. 2 satisfy partial symmetry requirements. But they are not completely symmetric as required by Doubrava '485 (i.e., SymmetriCal™).

Less strict requirements in accordance with the method of the subject invention (which may be called, Partial SymmetriCal) provide more flexibility for fixture designs. For test fixtures that are supposed to be symmetric, the Partial SymmetriCal provides a means to check how good the symmetry assumption is.

Calibration of Partially Symmetric Fixtures

A partial symmetric fixture is characterized with a single 2-port S-parameter measurement. The mathematical process splits the fixture into two partially symmetric half-fixtures, completely describing each half in terms of 2-port S-parameters.

Measurement of a device under test (DUT) embedded between the half-fixtures can be easily de-embedded using the Half-fixture S-parameters, or equivalently, T-parameters.

The partially symmetric fixture F and its components X and Y can be characterized in terms of S-parameters:

$$Sx = \begin{pmatrix} Sx_{11} & Sx_{12} \\ Sx_{21} & Sx_{22} \end{pmatrix}$$

$$Sy = \begin{pmatrix} Sy_{11} & Sy_{12} \\ Sy_{21} & Sy_{22} \end{pmatrix}$$

$$Sf = \begin{pmatrix} Sf_{11} & Sf_{12} \\ Sf_{21} & Sf_{22} \end{pmatrix}$$

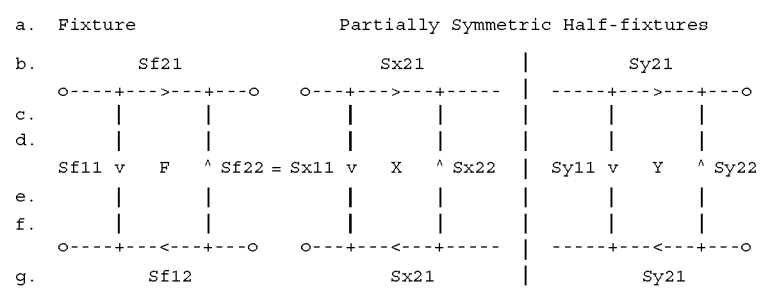

```
a.  Fixture              Partially Symmetric Half-fixtures
b.          Sf21                   Sx21                  Sy21
    o----+--->---+---o     o---+--->---+-----  |  -----+--->---+---o
c.      |       |             |       |        |      |       |
d.      |       |             |       |        |      |       |
    Sf11 v   F   ^ Sf22 = Sx11 v   X   ^ Sx22  | Sy11 v   Y   ^ Sy22
e.      |       |             |       |        |      |       |
f.      |       |             |       |        |      |       |
    o----+---<---+---o     o---+---<---+-----  |  -----+---<---+---o
g.          Sf12                   Sx21                  Sy21
```

The partial symmetric constraints is reflected in the model as $$Sx_{22} = Sy_{11} \quad (1)$$

The reciprocity constraints applied to each component X, Y as well as whole fixture F yields:

$$Sx_{12} = Sx_{21}$$

$$Sy_{12} = Sy_{21}$$

$$Sf_{12} = Sf_{21} \quad (2)$$

The S-parameters of X, Y and F are related by $$\begin{bmatrix} Sf_{11} & Sf_{12} \\ Sf_{21} & Sf_{22} \end{bmatrix} = \begin{bmatrix} Sx_{11} + \dfrac{Sx_{12} \cdot Sy_{11} \cdot Sx_{21}}{1 - Sx_{22} \cdot Sy_{11}} & \dfrac{Sx_{12} \cdot Sy_{12}}{1 - Sx_{22} \cdot Sy_{11}} \\ \dfrac{Sy_{21} \cdot Sx_{21}}{1 - Sx_{22} \cdot Sy_{11}} & Sy_{22} + \dfrac{Sy_{21} \cdot Sx_{22} \cdot Sy_{12}}{1 - Sx_{22} \cdot Sy_{11}} \end{bmatrix} \quad (3)$$

In the equation (3), $Sf_{11}$, $Sf_{12}$, $Sf_{22}$ can be obtained through two port measurements using a Vector Network Analyzer (VNA) or a Time Domain Reflectometer (TDR) on the whole fixture F; $Sx_{11}$ and $Sy_{22}$ can be obtained using the time domain gating method described in Doubrava '489.

Only three independent variables $Sx_{12}$, $Sy_{12}$, $Sx_{22}$ are unknown in (3). These three unknown variables can be resolved from three independent equations in (3) as following, $$\dfrac{Sx_{12} \cdot Sy_{11} \cdot Sx_{21}}{1 - Sx_{22} \cdot Sy_{11}} = Sf_{11} - Sx_{11} \quad (4)$$

$$\dfrac{Sx_{12} \cdot Sy_{12}}{1 - Sx_{22} \cdot Sy_{11}} = Sf_{12} \quad (5)$$

$$\dfrac{Sy_{21} \cdot Sx_{22} \cdot Sy_{12}}{1 - Sx_{22} \cdot Sy_{11}} = Sf_{22} - Sy_{22} \quad (6)$$

Multiplying (4) with (6) and dividing square of (5) yields $$Sx_{22} = \pm \sqrt{\dfrac{(Sf_{11} - Sx_{11})(Sf_{22} - Sy_{22})}{Sf_{12}^2}} \quad (7)$$

Plugging (7) into (4) and (6) respectively to get $$Sx_{12} = \pm \sqrt{\dfrac{(Sf_{11} - Sx_{11})(1 - Sx_{22}^2)}{Sx_{22}}} \quad (8)$$

$$Sy_{12} = \pm \sqrt{\dfrac{(Sf_{22} - Sy_{22})(1 - Sx_{22}^2)}{Sx_{22}}} \quad (9)$$

The signs in (7) (8) and (9) affect phase of S parameters. They can be resolved from time domain measurement and continuity of phase.

If $Sx_{22} = 0$, then $Sx_{12}$, $Sy_{12}$ can not be computed from (8) and (9). Instead, they need to be resolved from $$Sx_{12} \cdot Sy_{12} = Sf_{12} \quad (10)$$

Extra knowledge of relation between $Sx_{12}$ and $Sy_{12}$ are needed to resolve them: for example, if THRU are symmetric, then $$Sx_{12} = Sy_{12}$$

Or, if traces on left and right are uniform, but the trace in X side is twice as long as the trace in Y side, then $$Sx_{12} = Sy_{12} \cdot Sy_{12}$$

Combining the relation between $Sx_{12}$ and $Sy_{12}$ with (10), $Sx_{12}$ and $Sy_{12}$ can be resolved.

For a completely symmetric fixture, which is considered in Doubrava '485, (1) will have two extra symmetric terms $$Sx_{12} = Sy_{12}$$

$$Sx_{11} = Sy_{22}$$

It can be verified that equations (3)-(10) with these two extra symmetric terms yield the same results as in Doubrava '485.

The subject invention (Partial SymmetriCal) can handle fixtures satisfying partial symmetry requirement, which is less strict than completely symmetric required by the SymmetriCal (Doubrava '485) method. For completely symmetric fixture, the Partial SymmetriCal yields the same result as SymmetriCal. For fixtures that are very close to symmetric, the Partial SymmetriCal provides a check on how symmetry it is, and can calibrate out asymmetry. The subject method (Partial SymmetriCal) is the super set of SymmetriCal; the Partial SymmetriCal involves more steps to gain more accurate calibration results. For the fixtures that are almost completely symmetric, if calibration efficiency is preferred over accuracy, then the SymmetriCal should be used; if accuracy is preferred over efficiency, then the Partial SymmetriCal should be used.

It is noted that the subject invention is also useful in combination with the teaching of U.S. patent application Ser. No. 12/117,461 CALIBRATED S-PARAMETER MEASUREMENTS OF A HIGH IMPEDANCE PROBE (Hagerup, et al.), herein incorporated by reference.

What is claimed is:

1. A method for characterizing a partially symmetrical test fixture, comprising the steps of:
   providing a partially symmetrical test fixture;
   assigning a partial symmetric constraint of $Sx_{22} = Sy_{11}$;
   assigning a designation x to one portion of said test fixture having S-parameters $Sx_{11}$, $Sx_{12} = Sx_{21}$, and $Sx_{22}$ and a designation y to the remainder of said test fixture having S-parameters $Sy_{11}$, $Sy_{12}$ $Sy_{21}$ and $Sy_{22}$ for computation purposes;
   obtaining S-parameters $Sf_{11}$, $Sf_{12}$, and $Sf_{22}$ of said test fixture through two port measurements using a Vector Network Analyzer (VNA) or a Time Domain Reflectometer (TDR);
   obtaining S-parameters $Sx_{11}$ and $Sy_{22}$ through two port measurements using a time domain gating method;

$$\text{solving} = \pm \sqrt{\dfrac{(Sf_{11} - Sx_{11})(Sf_{22} - Sy_{22})}{Sf_{12}^2}} \ ;$$

$$\text{solving} = \pm \sqrt{\dfrac{(Sf_{11} - Sx_{11})(1 - Sx_{22}^2)}{Sx_{22}}} \ ; \text{ and}$$

$$\text{solving} = \pm\sqrt{\frac{(Sf_{22} - Sy_{22})(1 - Sx_{22}^2)}{Sx_{22}}}.$$

2. A method for characterizing a partially symmetrical test fixture, comprising the steps of:
   providing a partially symmetrical test fixture;
   assigning a partial symmetric constraint of $Sx_{22}=Sy_{11}$;
   assigning a designation x to one portion of said test fixture having S-parameters $Sx_{11}$, $Sx_{12}=Sx_{21}$, and $Sx_{22}$ and a designation y to the remainder of said test fixture having S-parameters $Sy_{11}$, $Sy_{12}$ $Sy_{21}$ and $Sy_{22}$ for computation purposes;
   obtaining S-parameters $Sf_{11}$, $Sf_{12}$, and $Sf_{22}$ of said test fixture through two port measurements using a Vector Network Analyzer (VNA) or a Time Domain Reflectometer (TDR);
   obtaining S-parameters $Sx_{11}$ and $Sy_{22}$ through two port measurements using a time domain gating method;

$$\text{solving} = \pm\sqrt{\frac{(Sf_{11} - Sx_{11})(Sf_{22} - Sy_{22})}{Sf_{12}^2}};$$

wherein when $Sx_{22}$ is equal to zero and THRU traces of said fixture are symmetric then $Sx_{12} \cdot Sy_{12} = Sf_{12}$ and $Sx_{12} = Sy_{12}$.

3. A method for characterizing a partially symmetrical test fixture, comprising the steps of:
   providing a partially symmetrical test fixture;
   assigning a designation x to one portion of said test fixture having S-parameters $Sx_{11}$, $Sx_{12}=Sx_{21}$, and $Sx_{22}$ and a designation f to the remainder of said test fixture having S-parameters $Sy_{11}$, $Sy_{12}$ $Sy_{21}$ and $Sy_{22}$, and a designation f to the entire test fixture for computational purposes;
   assigning a partial symmetric constraint of $Sx_{22}=Sy_{11}$;
   obtaining S-parameters $Sf_{11}$, $Sf_{12}$, and $Sf_{22}$ of said test fixture through two port measurements using a Vector Network Analyzer (VNA) or a Time Domain Reflectometer (TDR);
   obtaining S-parameters $Sx_{11}$ and $Sy_{22}$ through two port measurements using a time domain gating method;

$$\text{solving} = \pm\sqrt{\frac{(Sf_{11} - Sx_{11})(Sf_{22} - Sy_{22})}{Sf_{12}^2}};$$

wherein when $Sx_{22}$ is equal to zero and THRU traces of said fixture are uniform, then using the ratio between the physical length of the trace on x side and the physical length of the trace on y side to establish the relationship between $Sx_{12}$ and $Sy_{12}$.

4. A method for characterizing a partially symmetrical test fixture, comprising the steps of:
   providing a partially symmetrical test fixture;
   assigning a designation x to one portion of said test fixture having S-parameters $Sx_{11}$, $Sx_{12}=Sx_{21}$, and $Sx_{22}$ and a designation y to the remainder of said test fixture having S-parameters $Sy_{11}$, $Sy_{12}$ $Sy_{21}$ and $Sy_{22}$, and a designation f to the entire test fixture for computational purposes;
   assigning a partial symmetric constraint of $Sx_{22}=Sy_{11}$;
   obtaining S-parameters $Sf_{11}$, $Sf_{12}$, and $Sf_{22}$ of said test fixture through two port measurements using a Vector Network Analyzer (VNA) or a Time Domain Reflectometer (TDR);
   obtaining S-parameters $Sx_{11}$ and $Sy_{22}$ through two port measurements using a time domain gating method;

$$\text{solving } Sx_{22} = \pm\sqrt{\frac{(Sf_{11} - Sx_{11})(Sf_{22} - Sy_{22})}{Sf_{12}^2}}$$

wherein when $Sx_{22}$ is equal to zero and THRU traces of said fixture are uniform, then using the ratio between the physical length of the trace on x side and the physical length of the trace on y side to establish the relationship between $Sx_{12}$ and $Sy_{12}$;
wherein the step of using the physical length of the traces to establish the relationship between $Sx_{11}$ and $Sy_{12}$ includes a case in which said traces on said x portion of said test fixture are twice as long as said traces on said y side of said test fixture, then $Sx_{12}$ and $Sy_{12}$ exhibit a relationship of $Sx_{12}=Sy_{12} \cdot Sy_{12}$; and
when such relation between $Sx_{12}$ and $Sy_{12}$ is established based on said length ratio, then solving for $Sx_{12}$ and $Sy_{12}$ by use of $Sx_{12} \cdot Sy_{12} = Sf_{12}$.

\* \* \* \* \*